US011764306B2

(12) United States Patent
Le et al.

(10) Patent No.: US 11,764,306 B2
(45) Date of Patent: *Sep. 19, 2023

(54) MULTI-LAYER CRYSTALLINE BACK GATED THIN FILM TRANSISTOR

(71) Applicant: Intel Corporation, Santa Clara, CA (US)

(72) Inventors: Van H. Le, Portland, OR (US); Abhishek A. Sharma, Hillsboro, OR (US); Gilbert Dewey, Hillsboro, OR (US); Kent Millard, Hillsboro, OR (US); Jack Kavalieros, Portland, OR (US); Shriram Shivaraman, Hillsboro, OR (US); Tristan A. Tronic, Aloha, OR (US); Sanaz Gardner, Portland, OR (US); Justin R. Weber, Hillsboro, OR (US); Tahir Ghani, Portland, OR (US); Li Huey Tan, Hillsboro, OR (US); Kevin Lin, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 78 days.

This patent is subject to a terminal disclaimer.

(21) Appl. No.: 17/472,879

(22) Filed: Sep. 13, 2021

(65) Prior Publication Data

US 2021/0408299 A1    Dec. 30, 2021

Related U.S. Application Data

(63) Continuation of application No. 16/640,340, filed as application No. PCT/US2017/054589 on Sep. 29, 2017, now Pat. No. 11,152,514.

(51) Int. Cl.
*H01L 29/786* (2006.01)
*H01L 27/12* (2006.01)
(Continued)

(52) U.S. Cl.
CPC .... *H01L 29/78693* (2013.01); *H01L 27/1207* (2013.01); *H01L 27/1225* (2013.01);
(Continued)

(58) Field of Classification Search
CPC .......... H01L 29/78693; H01L 27/1207; H01L 27/1225; H01L 27/1255; H01L 29/66969;
(Continued)

(56) References Cited

U.S. PATENT DOCUMENTS 6,787,806 B1    9/2004 Yamazaki et al.
11,152,514 B2 *  10/2021 Le ...................... H01L 27/1225
(Continued)

FOREIGN PATENT DOCUMENTS

KR    1020170044071 A    4/2017

OTHER PUBLICATIONS

International Search Report and Written Opinion for PCT/US2017/054589, dated Jun. 28, 2018. 16 pages.
International Preliminary Report on Patentability received for PCT/US2017/054589, dated Apr. 9, 2020. 10 pages.

*Primary Examiner* — Tong-Ho Kim
(74) *Attorney, Agent, or Firm* — Finch & Maloney PLLC (57) ABSTRACT

Described is an apparatus which comprises: a gate comprising a metal; a first layer adjacent to the gate, the first layer comprising a dielectric material; a second layer adjacent to the first layer, the second layer comprising a second material; a third layer adjacent to the second layer, the third layer comprising a third material including an amorphous metal oxide; a fourth layer adjacent to the third layer, the fourth layer comprising a fourth material, wherein the fourth and second materials are different than the third material; a source partially adjacent to the fourth layer; and a drain partially adjacent to the fourth layer.

20 Claims, 9 Drawing Sheets

(51) Int. Cl.
*H01L 29/66* (2006.01)
*H01L 29/267* (2006.01)

(52) U.S. Cl.
CPC .... *H01L 27/1255* (2013.01); *H01L 29/66969* (2013.01); *H01L 29/78696* (2013.01); *H01L 29/267* (2013.01)

(58) Field of Classification Search
CPC ............ H01L 29/78696; H01L 29/267; H01L 27/0688; H01L 29/7869; H01L 45/1233; H01L 45/141; H01L 45/147; H01L 45/148; H01L 27/10873; H01L 45/04; H01L 45/146
USPC .......................................................... 257/43
See application file for complete search history.

(56) References Cited

U.S. PATENT DOCUMENTS

| | | |
|---|---|---|
| 2008/0210945 A1 | 9/2008 | Miyairi |
| 2013/0037798 A1 | 2/2013 | Wong et al. |
| 2013/0087783 A1 | 4/2013 | Wang et al. |
| 2014/0110700 A1 | 4/2014 | Hsu et al. |
| 2015/0179815 A1* | 6/2015 | Ahmed ............... H01L 29/7869 257/24 |
| 2015/0249096 A1 | 9/2015 | Lupino et al. |
| 2017/0033109 A1* | 2/2017 | Yamazaki ......... H01L 27/10858 |
| 2017/0141230 A1 | 5/2017 | Ikeda et al. |
| 2019/0355725 A1 | 11/2019 | Le et al. |
| 2020/0357929 A1 | 11/2020 | Le et al. |

\* cited by examiner

MULTI-LAYER CRYSTALLINE BACK GATED THIN FILM TRANSISTOR

This application is a continuation of U.S. application Ser. No. 16/640,340 filed Feb. 19, 2020, which is a National Stage Application of PCT/US2017/054589 filed Sep. 29, 2017, each of which is hereby incorporated herein by reference in its entirety.

BACKGROUND

Embedded memory has become increasingly common in the design of integrated circuits (ICs). For example, embedded memory may be integrated with a host IC as a multi-chip module (MCM) or may be monolithically integrated with a host IC (e.g., both memory and the host IC fabricated on the same chip). For embedded memory applications, reducing the overall memory array footprint helps achieve larger memories and/or reduce device cost.

One form of embedded memory is embedded dynamic random access memory (eDRAM). The architecture of eDRAM is based on a 1T-1C cell (one transistor and one capacitor cell) that includes a "write" or "select" transistor and a storage capacitor, eDRAM may be integrated with a host microprocessor chip (such as a central processing unit or "CPU") at the package level, for example, to form a central processor MCM. Integration of both a memory device and a processor proximate to one another in a same package may, for example, enable communication between the memory device and the processor through a local bus capable of higher bandwidths and/or lower signal latencies relative to separately packaged chips communicating through a printed circuit board (PCB) bus.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

For some eDRAM devices, a transistor of a memory cell is fabricated on and/or within a monocrystalline semiconductor during front-end-of-line (FEOL) or frontend processing. The capacitor of the memory cell may either be fabricated in the FEOL, and/or fabricated in the back-end-of-line (BEOL) or backend. A transistor and capacitor of each memory cell (or bit-cell) are electrically coupled through one or more metal interconnect layers formed in the BEOL.

Here, the term "backend" of BEOL generally refers to a section of a die which is opposite of a "frontend" and where an IC (integrated circuit) package couples to IC die bumps. For example, high level metal layers (e.g., metal layer 6 and above in a ten metal stack die) and corresponding vias that are closer to a die package are considered part of the backend of the die. The BEOL is the portion of IC fabrication where individual semiconductor devices (whether embedded memory or logic transistors) are interconnected to one another with electrically conductive features such as metal interconnect traces (lines) within a given metallization level and metal-filled conductive vias between multiple metallization levels. These conductive interconnects are embedded in a dielectric material so that the memory device is a monolithic integrated circuit. Conversely, the term "frontend" or FEOL generally refers to a section of the die that includes the traditional active region (e.g., where transistors (e.g., BJT, MOS) are fabricated) and low level metal layers and corresponding vias that are closer to the active region (e.g., metal layer 5 (M5) and below in a ten metal stack die example).

Referring back to the example of an eDRAM (1T-1C based memory), using a BEOL transistor, the traditional Si based 1T-1C memory can be replaced with a metal oxide based 1T-1C cell array. Currently, the metal oxide transistor is comprised of multiple layers for crystallization and passivation in a coplanar geometry (e.g., the source, drain and gate are coplanar). Typical amorphous oxide or other metal oxide TFTs are very susceptible to oxygen vacancy formation which highly dopes the film and ruins electrical performances. Such an architecture results in a poorly performing device in that the device may require a much larger turn off bias voltage than the turn on bias voltage (e.g., poor gate/channel control), poor current conduction because of irregular surfaces between various layers of the device, high device leakage when mobility is intended to increase, etc.

In some embodiments, a back-gate geometry (e.g., merely source and drain are coplanar) is used with a buried channel that is protected by crystalline and/or other passivation layers. As such, device architecture of various embodiments enables improved device stability and performances in metal oxide TFTs. In some embodiments, the back-gate TFT comprises: a gate comprising a metal; a first layer adjacent to the gate, the first layer comprising a dielectric material; a second layer adjacent to the first layer, the second layer comprising a second material; a third layer adjacent to the second layer, the third layer comprising a third material including an amorphous metal oxide; a fourth layer adjacent to the third layer, the fourth layer comprising a fourth material, wherein the second and fourth materials are different than the third material; a source partially adjacent to the fourth layer; and a drain partially adjacent to the fourth layer.

In some embodiments, the dielectric material is a high-K dielectric material which includes one or more of: hafnium silicate ($HfSiO_x$, where is a number e.g., 2, 4, etc.), zirconium silicate ($ZrSiO_4$), hafnium dioxide ($HfO_2$), zirconium dioxide ($ZrO_2$), aluminum oxide ($Al_2O_3$), or nitride hafnium silicate (HfSiON). In some embodiments, the dielectric material is a high-K dielectric material which includes one or more of: Hf, Si, O, Zr, Al, or N. In some embodiments, the second or fourth material includes one or more of: c axis aligned crystalline indium gallium zinc oxide (IGZO), crystalline IGZO, Yttrium-doped zinc oxide (YZO), Zinc oxide (ZnO), Indium Zinc Oxide (IZO), Zinc tin oxide (ZTO), low temperature (LT) poly Si, LT poly Germanium (Ge), or transmission metal di-chalcogenides (TMDs). In some embodiments, the TMDs include one or more of: $MoS_2$, $WS_2$, $MoSe_2$, $WSe_2$, or $MoTe_2$.

In some embodiments, the second or fourth materials include one or more of: In, Ga, Zn, O, Y, Sn, Ge, Si, Mo, Se, W, S, or Te. In some embodiments, the second and fourth materials are different. In some embodiments, the second and fourth materials are the same or identical. In some embodiments, the amorphous metal oxide of the third layer includes Indium gallium zinc oxide (IGZO). In some embodiments, the third layer includes one or more of: In, Ga, Zn, or O. In some embodiments, the second, third, and fourth layers have a combined thickness which is less than 60 nm. In some embodiments, each of the second, third, and fourth layers have a thickness in a range of 2 nm to 20 nm. In some embodiments, each of the second, third, and fourth layers have a length in a range of 30 nm to 180 nm. In some embodiments, the first layer has a thickness in range of 2 nm to 10 nm. In some embodiments, the gate has a thickness in a range of 5 nm to 20 nm. In some embodiments, the metal of the gate includes one or more of: Ti, N, Ta, W, C, Pt, Cr, Hf, TiN, TaN, or Ta. In some embodiments, the source and drain comprise a material which includes one or more of: TiN, TaN, Ti, N, Ta, W, C, Pt, Cr, Hf, or Ta. In some embodiments, the source and drain are separated by an insulator comprising oxygen. In some embodiments, the source and drain are separated by a distance in a range of 10 nm to 80 nm. In some embodiments, the gate is biased by a voltage in a range of −0.7 V to 3V.

The back-gate TFT of some embodiments exhibit high mobility with low leakage using high mobility material in combination of low leakage material. The back-gate TFT of some embodiments provides a high drive current because its channel is formed next to the gate resulting in low leakage. The high quality crystalline interfaces between the crystalline materials and the passivation region of the back-gate TFT enables the low leakage and better gate control than traditional TFTs. As such, a faster and thus higher performing eDRAM can be realized. Other technical effects will be evident from the various embodiments and figures.

In the following description, numerous details are discussed to provide a more thorough explanation of the embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials or materials may be directly in contact with the two layers or may have one or more intervening layers. In contrast, a first material "on" a second material is in direct contact with that second material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

It is pointed out that those elements of a figure having the same reference numbers (or names) as the elements of any other figure can operate or function in any manner similar to that described, but are not limited to such.

Figure 1:
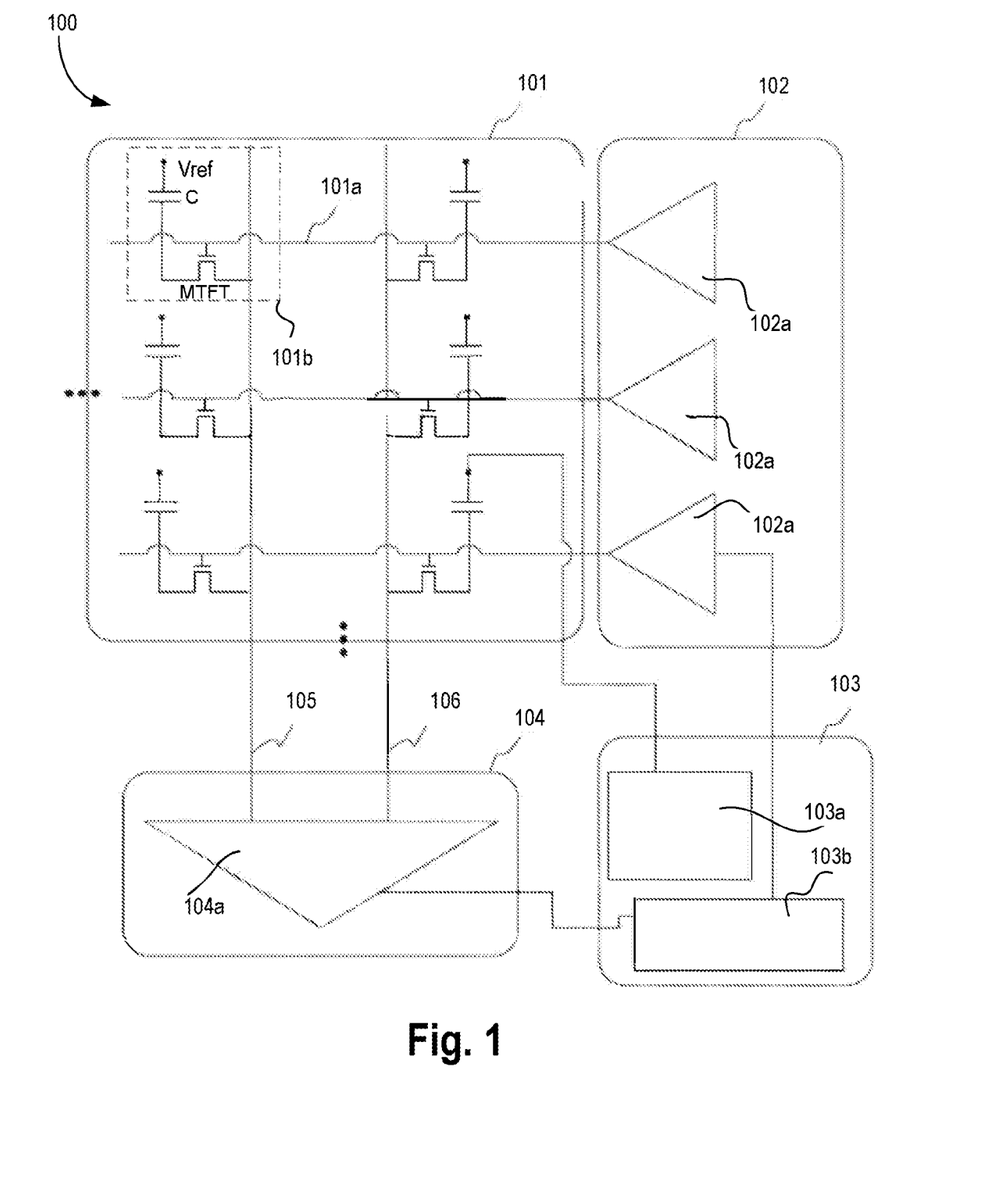
FIG. 1 illustrates a schematic of a back-gate multilayer crystalline thin film transistor (TFT) memory device structure, according to some embodiments of the disclosure.

FIG. 1 illustrates a schematic 100 of a back-gate multilayer crystalline TFT memory device structure, according to some embodiments of the disclosure. Memory devices comprising one or more arrays in which individual memory cells include a thin film select transistor and a capacitor (1T-1C) are described below. For some exemplary embodiments herein, the transistor of a 1T-1C storage cell is a TFT rather than a monocrystalline silicon-based transistor (e.g., MOSFET). Thin-film transistors (TFTs) are a class of field-effect transistors (FETs) in which the channel material is a deposited thin film rather than a monocrystalline material. A common application of TFT technology is liquid crystal displays (LCDs), but TFTs are also advantageous in other applications as the thin film deposition processes employed in TFT fabrication can be relatively low (e.g., below 450° C.), allowing TFTs to be inserted within layers of interconnect metallization of the type that is typically formed only after higher-temperature processing is completed in conventional silicon MOSFET fabrication technology. TFTs can be fabricated using a wide variety of semiconductor materials, such as silicon, germanium, silicon-germanium, as well as various oxide semiconductors (also known as semiconducting oxides) including metal oxides such as indium gallium zinc oxide (IGZO), indium zinc oxide (IZO), and the like.

TFT-based eDRAM embodiments described herein may advance MCM or monolithic integration of DRAM. The capacitors may be fabricated within metal interconnect levels while the TFTs are fabricated within other interconnect levels. TFT-based eDRAM embodiments described herein may also reduce the footprint of an eDRAM device by moving peripheral circuitry to a region of a monocrystalline device layer (e.g., silicon substrate) at least partially within a footprint of the storage capacitors.

In this high level view, the memory schematic or system 100 comprises memory array 101, row circuitry 102, control circuitry 103, and column circuitry 104. In some embodiments, memory array 101 is a two-dimensional (2D) array of 1 T-1C memory cells 101b. Each memory cell 101b includes a storage capacitor C (e.g., implemented as a metal-insulator-metal (MIM) capacitor), and a TFT transistor MTFT (also referred to as the select transistor). In some embodiments, the memory cells 101b are networked with conductive traces including word-lines (WL) 101a and bit-lines (BL) 105 and 106 (reference). In some embodiments, TFT transistor MTFT electrically couples the storage capacitor C forming the 1T-1C memory cell.

In some embodiments, memory array 101 is fabricated in the BEOL interconnect levels of an IC chip. In some embodiments, all of capacitors C, BLs 105, 106. WL 101a, and transistors MTFTs are fabricated within, and/or between, various interconnect metallization levels. In some embodiments, peripheral memory circuitry including at least one of row circuitry 102 and column circuitry 104, is fabricated in a device level that falls within at least some of the footprint of memory system 100.

For example, BLs 105, 106 may be electrically coupled to a sense amplifier 104a employing MOSFETs fabricated in a region of a monocrystalline semiconductor device layer (e.g., silicon substrate) that is at least partially underlying memory system 100. In some embodiments, WLs 101a are electrically coupled to WL drivers 102/102a that employ MOSFETs fabricated in a region of a monocrystalline semiconductor device layer (e.g., silicon substrate) that is at least partially underlying memory array 101.

In some embodiments, peripheral memory circuitry further includes control circuitry 103. One or more of memory array 101, row circuitry 102, and/or column circuitry 104 may be electrically coupled to control circuitry 103. In some embodiments, control circuitry 103 may also be fabricated in the device level that falls within the footprint of memory array 101. In some embodiments, control circuitry 103 may, for example, also employ MOSFETs fabricated in a region of a monocrystalline semiconductor device layer (e.g., silicon substrate) that is at least partially underlying memory array 101.

In some embodiments, control circuitry 103 may include, for example, various voltage biasing circuits, such as capacitor bias circuitry 103a. Control circuitry 103 may include, for example, various memory management circuitry, such as control logic 103b communicatively coupled into row circuitry 102 and column circuitry 104 so as to permit coordinated operation of sense amplifier 104a and WL driver 102.

A memory device architecture 100 employing TFTs in the memory array 101 enables vertical integration of the peripheral circuitry, in accordance with various embodiments. A concomitant performance gain in memory (e.g., higher current drive, lower leakage, and better gate control) is possible by fabricating the TFTs as multilayer crystalline passivated back-gate TFTs, in accordance with various embodiments.

Figure 2:
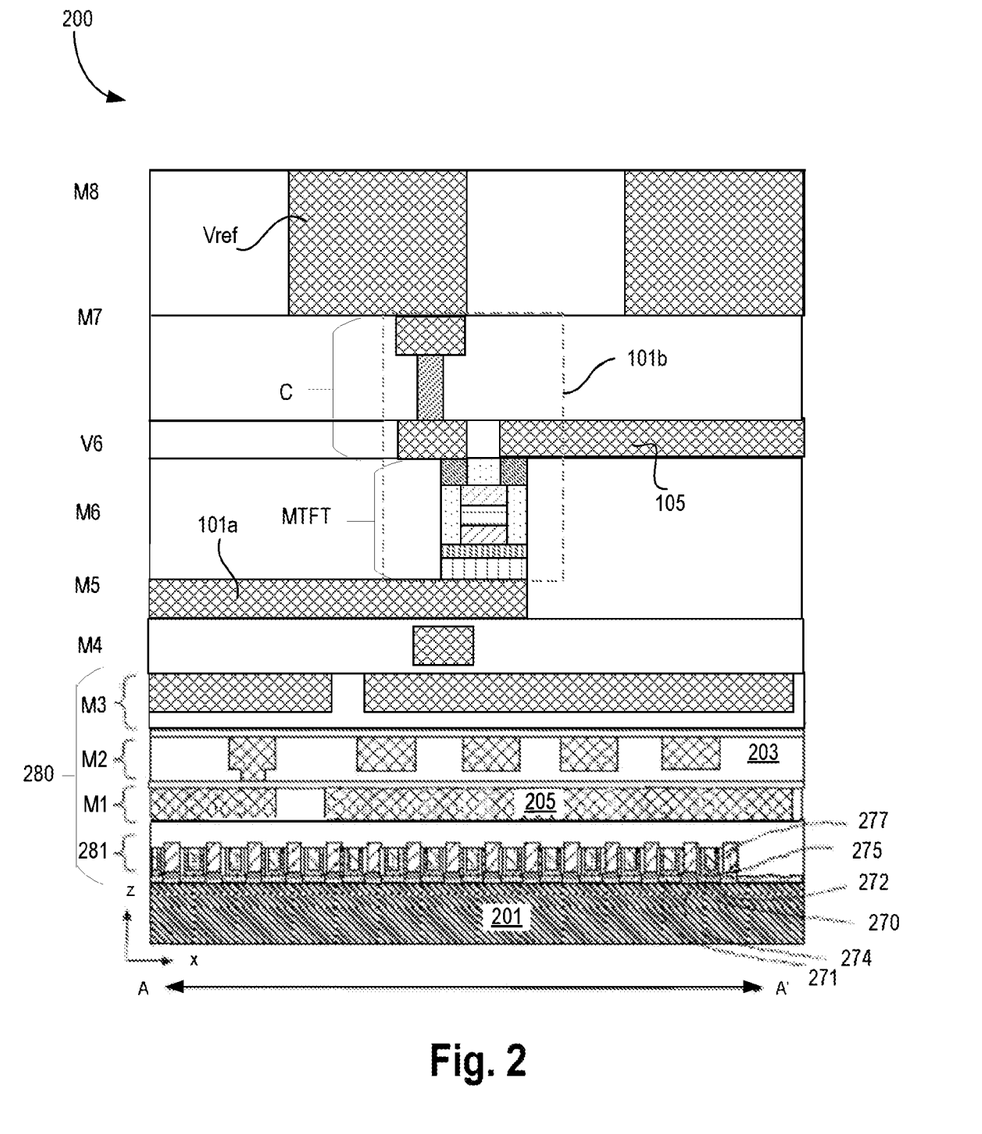
FIG. 2 illustrates a cross-sectional side view of the memory device structure of FIG. 1, in accordance with some embodiments.

FIG. 2 illustrates a cross-sectional side view of the memory device structure 200 of FIG. 1, in accordance with some embodiments. Structure 200 represents a portion of a monolithic IC including peripheral circuitry 280 fabricated over and/or on a substrate 201. Peripheral circuitry 280 includes a plurality of MOSFETs 281 that employ a monocrystalline semiconductor for at least the channel semiconductor 271. Peripheral circuitry 280 may further include one or more levels of interconnect metallization 205 embedded in dielectric material layers 203, 204. In some embodiments, peripheral circuitry 280 includes metal-one (M1), metal-two (M2) and metal-three (M3) interconnect metallization levels.

A plurality of MTFTs is located over peripheral circuitry 280. These MTFTs employ multilayers of crystalline material as described in FIGS. 3A-H. Memory cell 101b is denoted by dot-dashed line in FIG. 2. In this example, the MTFTs are fabricated in the metal 6 (M6) region, and are coupled to word-line 101a and bit-line 105. In some embodiments, MTFTs make a highly regular array that can be fabricated with merely a few masks that establish initial grating patterns. Such 2D line patterns can be fabricated at nanometer dimensions (e.g., 10-20 nm features, or less). In some embodiments, self-aligned etch processes and/or damascene techniques, which are all highly scalable, may then be enlisted to generate TFTs 282 based on the initial grating pattern(s). Continuing with cross-section 200, in this example, capacitor C is formed in metal 7 (M7) region and connected to MTFT using via V6. In some embodiments, one terminal of capacitor C is coupled to metal 8 (M8) which is provided a bias, Vref.

FIGS. 3A-H illustrate cross-sections 300, 320, 330, 340, 350, 360, 370, and 380, respectively, of materials as a back-gate multilayer crystalline TFT is formed, in accordance with some embodiments.

Figure 3A:
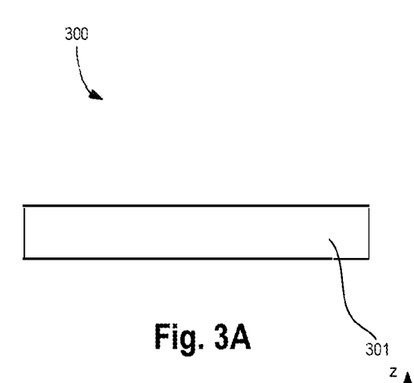
FIGS. 3A-H illustrate cross-sections of materials as the back-gate multilayer crystalline TFT is formed, in accordance with some embodiments.

Cross-section 300 illustrates formation of gate 301. In various embodiments, TFT formed here is a back-gate TFT where the gate is formed first. In some embodiments, the gate comprises a metal. For example, the metal of the gate includes one or more of: TiN, TaN, Ti. N. Ta, W, C. Pt. Cr, Hf, or Ta. In some embodiments, the gate has a thickness (t1) in the range of 5 nm (nanometer) to 20 nm.

Figure 3B:
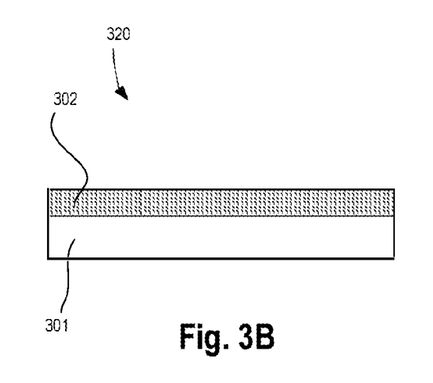

Cross-section 320 illustrates deposition of insulating layer 302 over gate 301. In some embodiments, insulating layer 302 comprises a dielectric material. In some embodiments, the dielectric material is a high-K dielectric material which includes one or more of: hafnium silicate ($HfSiO_4$), zirconium silicate ($ZrSiO_4$), hafnium dioxide ($HfO_2$), zirconium dioxide ($ZrO_2$), aluminum oxide ($Al_2O_3$), nitride hafnium silicate (HfSiON), SiN, $HfO_2$, $SiO_2$, $Al_2O_3$, or AlN and the like. In some embodiments, the dielectric material is a high-K dielectric material which includes one or more of: Hf, Si, O, Zr, Al, or N. In some embodiments, insulating layer 302 has a thickness (t2) in a range of 2 nm to 10 nm.

Figure 3C:
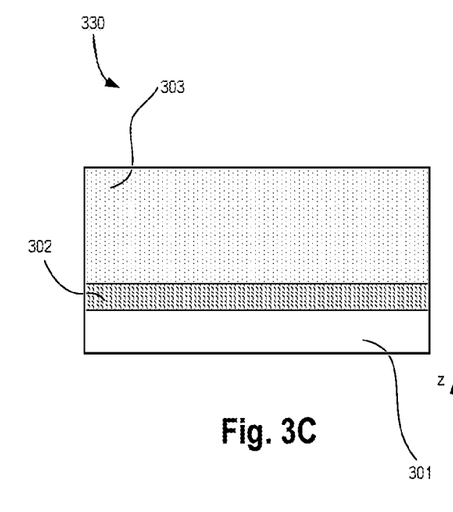

Cross-section 330 illustrates deposition of passivation material 303. In some embodiments, passivation material 303 is an Interlayer Dielectric (ILD). For example, porous $SiO_2$, fluorine-doped $SiO_2$, carbon-doped $SiO_2$, porous-doped $SiO_2$, spin-on silicon based polymeric dielectric, spin-on organic polymeric dielectric, can be used as ILD. In some embodiments, the thickness of the ILD is less than or equal to 60 nm.

Figure 3D:
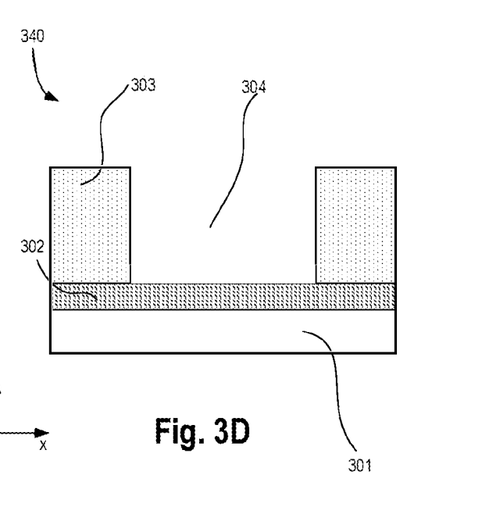

Cross-section 340 illustrates etching of the passivation material 303 up to insulating layer 302. Any known methods and techniques can be used to etch passivation material 303 leaving a trench 304. In various embodiments, trench 304 is used to form or grow the crystalline layers including the channel.

Figure 3E:
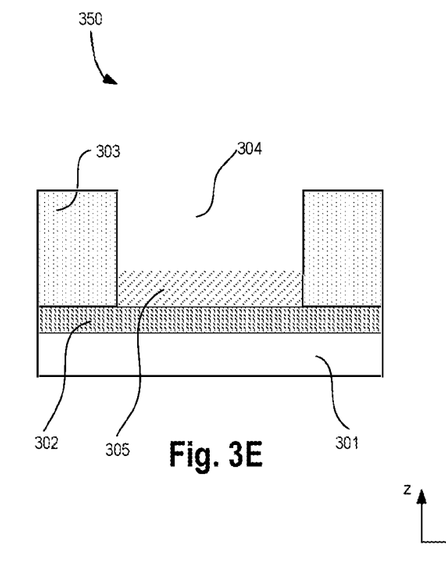

Cross-section 350 illustrates deposition of first crystalline material 305 over insulating layer 302 in trench 304. In some embodiments, first crystalline material 305 includes one or more of: c-axis aligned crystalline Indium gallium zinc oxide (IGZO), crystalline IGZO, Yttrium-doped zinc oxide (YZO), Zinc oxide (ZnO), Indium Zinc Oxide (IZO), Zinc tin oxide (ZTO), low temperature (LT) poly Si, LT poly Germanium (Ge), or transmission metal di-chalcogenides (TMDs). In some embodiments, the TMDs include one or more of: $MoS_2$, $WS_2$, $MoSe_2$, $WSe_2$, or $MoTe_2$. In some embodiments, first crystalline material 305 includes one or more of: In, Ga, Zn, O, Y, Sn, Ge, Si, Mo, Se, W, S, or Te. In some embodiments, first crystalline material 305 has a thickness (t3) in a range of 2 nm to 20 nm.

Figure 3F:
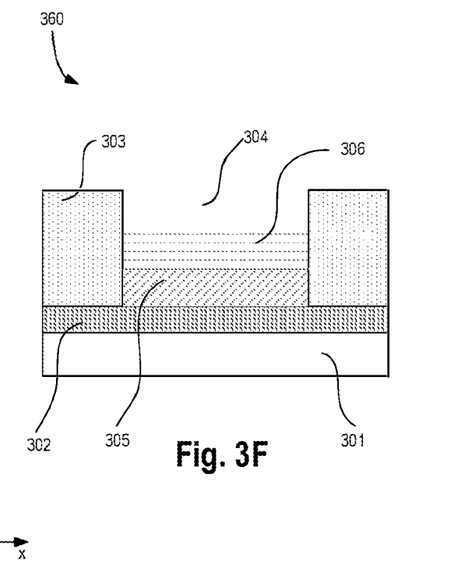

Cross-section 360 illustrates growing of second crystalline material 306 over first crystalline material 305. In some embodiments, second crystalline material 306 comprises an amorphous metal oxide. In some embodiments, second crystalline material 306 includes Indium gallium zinc oxide (IGZO). In some embodiments, second crystalline material 306 includes one or more of: In, Ga, Zn, or O. In some embodiments, second crystalline material 306 has a thickness (t4) in a range of 2 nm to 20 nm. In some embodiments, first crystalline material 305 is used to template second crystalline material 306, and as such, the interface between second crystalline material 306 and first crystalline material 305 is pristine. A pristine interface results in improved gate control and this lowers the leakage compared to traditional TFTs. In some embodiments, second crystalline material 306 forms the channel of the TFT. In some embodiments, to make an n-type TFT, the second crystalline material 306 can include one or more of: ITO, IGZO, IZO, AZO, zinc oxide, amorphous silicon (a-Si), a-Ge, poly-Si, or poly-Ge. or poly-Group III-V elements. In some embodiments, to make a p-type TFT, the second crystalline material 306 can include one or more of: zinc oxide, copper oxide ($Cu_2O$), tin oxide ($SnO_x$), a-Si, a-Ge, or poly-Ge, or poly-Group III-V elements.

Figure 3G:
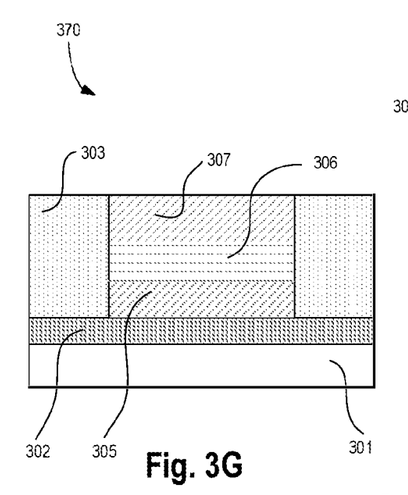

Cross-section 370 illustrates growing of third crystalline material 307 over second crystalline material 306. In some embodiments, third crystalline material 307 can be a high mobility and low leakage material which can provide high drive current with low leakage. In some embodiments, third crystalline material 307 makes a pristine interface passivation material 303 which results in better gate control compared to traditional TFTs. In some embodiments, third crystalline material 307 includes one or more of: c-axis aligned crystalline IGZO, crystalline IGZO, YZO. ZnO, IZO, ZTO, LT poly Si, LT poly Ge, or TMDs. In some embodiments, third crystalline material 307 includes one or more of: In, Ga, Zn, O, Y, Sn, Ge, Si, Mo, Se, W, S, or Te. In some embodiments, third crystalline material 307 has a thickness (t5) in a range of 2 nm to 20 nm. In some embodiments, first and third crystalline materials are the same. In some embodiments, first and third crystalline materials are different. In some embodiments, after third crystalline material 307 is deposited, the surface is polished and prepared for deposition of source and drain regions. In various embodiments, by placing the second crystalline material 306 between layers 305 and 307, the channel which is formed by second crystalline material 306 is protected from further processing steps.

Figure 3H:
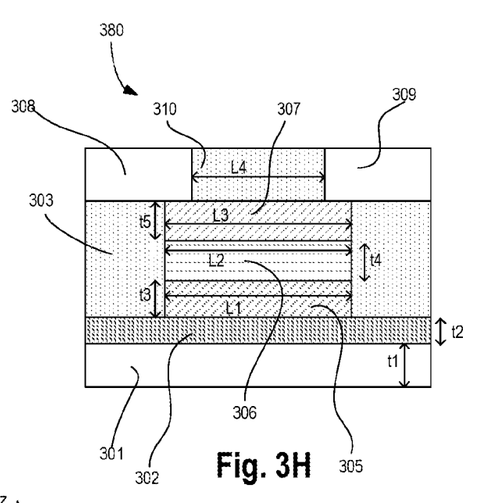

Cross-section 308 illustrates the deposition of source 308 and drain 309. In some embodiments, the region between source 308 and drain 309 is filled with passivation material 310 which can be the same as material 303. In various embodiments, third crystalline material 307 makes a clean interface with passivation material 310. In some embodiments, source 308 is partially adjacent to third crystalline material 307. In some embodiments, drain 309 is partially adjacent to third crystalline material 307. In some embodiments, the source 308 and drain 309 comprise a material which includes one or more of: Ti, N, Ta, W, C, Pt, Cr, Hf, or Ta. In some embodiments, the source 308 and drain 309 are separated by an insulator comprising O. For example, passivation material 310 includes O. In some embodiments, source 308 and drain 309 are formed of the same material as gate 301.

In some embodiments, the first, second, and third crystalline materials have a combined thickness which is less than 60 nm. In some embodiments, each of the first, second, and third crystalline materials have a length (e.g., L1, L2, and L3, respectively) in a range of 30 nm to 180 nm. In some embodiments, the source and drain are separated by a distance (L4) in a range of 10 nm to 80 nm. In various embodiments, MTFT is a short channel device to improve density of the memory array 101. In some embodiments, the gate 301 is biased by a voltage in a range of −0.7 V to 3.3V. For example, for embedded applications, the gate 301 can be biased as low as −0.7V, while for standalone applications, the gate can be biased as high as 3.3V.

Figure 4:
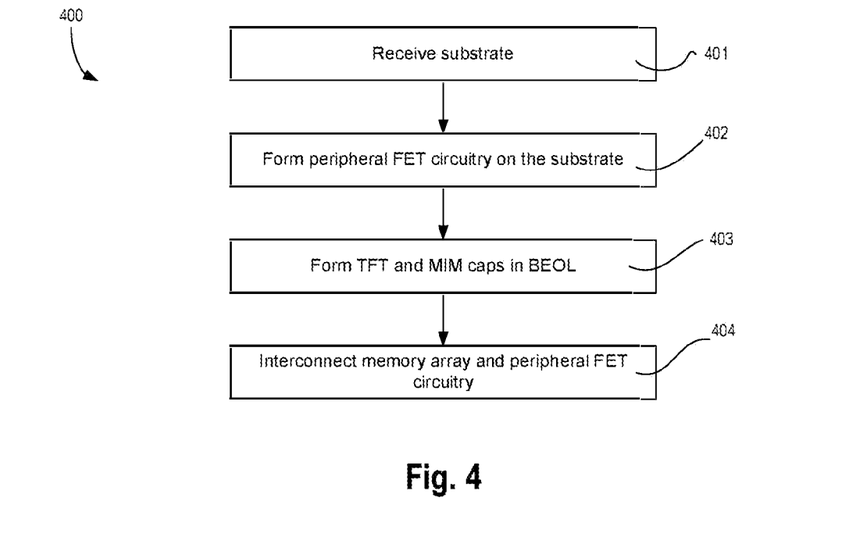
FIG. 4 is a flow diagram illustrating a method for fabricating a memory device using a back-gate multilayer crystalline TFT, in accordance with some embodiments.

FIG. 4 is a flowchart 400 illustrating methods for fabricating a memory device, in accordance with some embodiments. Flow chart 400 begins at block (or operation) 401 where a substrate is received. In some embodiments, the substrate advantageously includes a monocrystalline semiconductor layer, such as a silicon layer, upon which FETs may be formed. At operation 402, FETs (e.g., MOSFETs) are fabricated using any known technique and interconnected with FEOL metallization levels to form peripheral FET circuitry. In some examples, both n-type and p-type FETs are fabricated at operation 402 and interconnected into a CMOS peripheral circuit. At operation 403, TFTs and MIM trench capacitors are fabricated within BEOL metallization levels over the FET circuitry. In some exemplary embodiments, TFTs are fabricated in a metallization level over the peripheral circuit and the MIM capacitors are fabricated in a metallization level over the TFTs. The TFTs are interconnected to the MIM capacitors with traces fabricated at these same metallization levels to form a memory array. Flowchart 400 is then completed at operation 404 where one or more top metallization levels are fabricated to interconnect the memory array with the peripheral circuitry.

Figure 5:
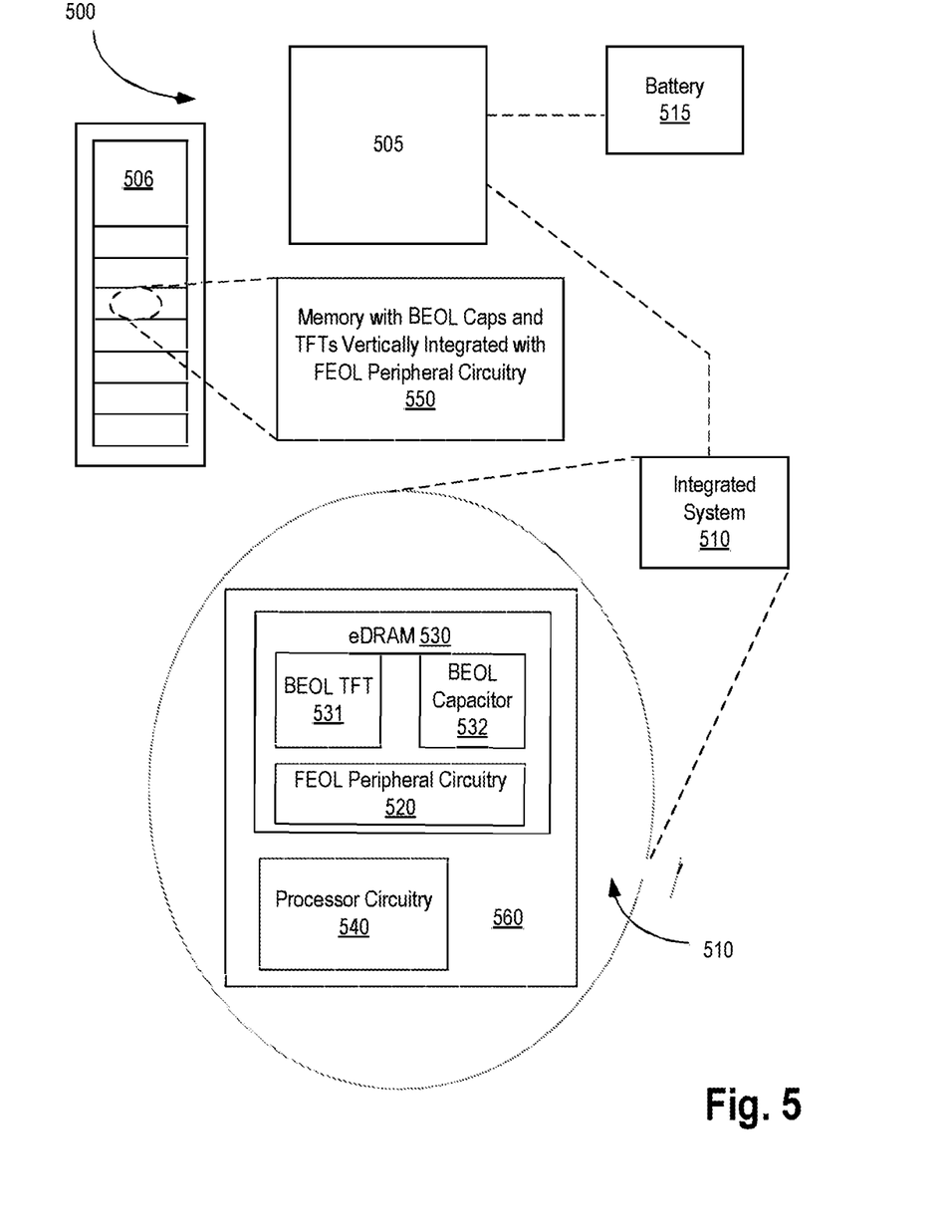
FIG. 5 illustrates a mobile computing platform and a data server machine including a memory device with back-end-of-line (BEOL) capacitors and back-gate multilayer crystalline TFTs vertically integrated with front-end-on-line (FEOL) peripheral circuitry, in accordance with some embodiments.

FIG. 5 illustrates a mobile computing platform 500 and a data server machine including a memory device with BEOL capacitors and back-gate multilayer crystalline TFTs vertically integrated with FEOL peripheral circuitry, in accordance with some embodiments.

In some embodiments, the server machine 506 may be any commercial server, for example including any number of high-performance computing platforms disposed within a rack and networked together for electronic data processing, which in the exemplary embodiment includes a packaged monolithic or MCM IC-eDRAM device. The mobile computing platform 505 may be any portable device configured for each of electronic data display, electronic data processing, wireless electronic data transmission, or the like, in accordance with some embodiments. For example, the mobile computing platform 505 may be any of a tablet, a smart phone, laptop computer, etc., and may include a display screen (e.g., a capacitive, inductive, resistive, or optical touchscreen), a chip-level or package-level integrated system 510, and a battery 515.

In some embodiments, disposed within the integrated system 510, a substrate 560 includes an eDRAM 530 and processor circuitry 540 (e.g., a microprocessor, a multi-core microprocessor, graphics processor, or the like). In some embodiments, eDRAM 530 includes 1C-1TFT cells, with each cell including a BEOL TFT 531 and a BEOL capacitor 532, for example as described elsewhere herein. For monolithic embodiments, substrate 560 is a semiconductor chip. For MCM embodiments, substrate 560 may be any package substrate, or an interposer (e.g., an active interposer with active devices embedded in it). In some embodiments, processor circuitry 540, or a separate RFIC chip may be further coupled to an antenna (not shown) to implement any of a number of wireless standards or protocols, including but not limited to Wi-Fi (IEEE 1402.11 family), WiMAX (IEEE 802.16 family), IEEE 802.20, long term evolution (LTE). Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

Figure 6:
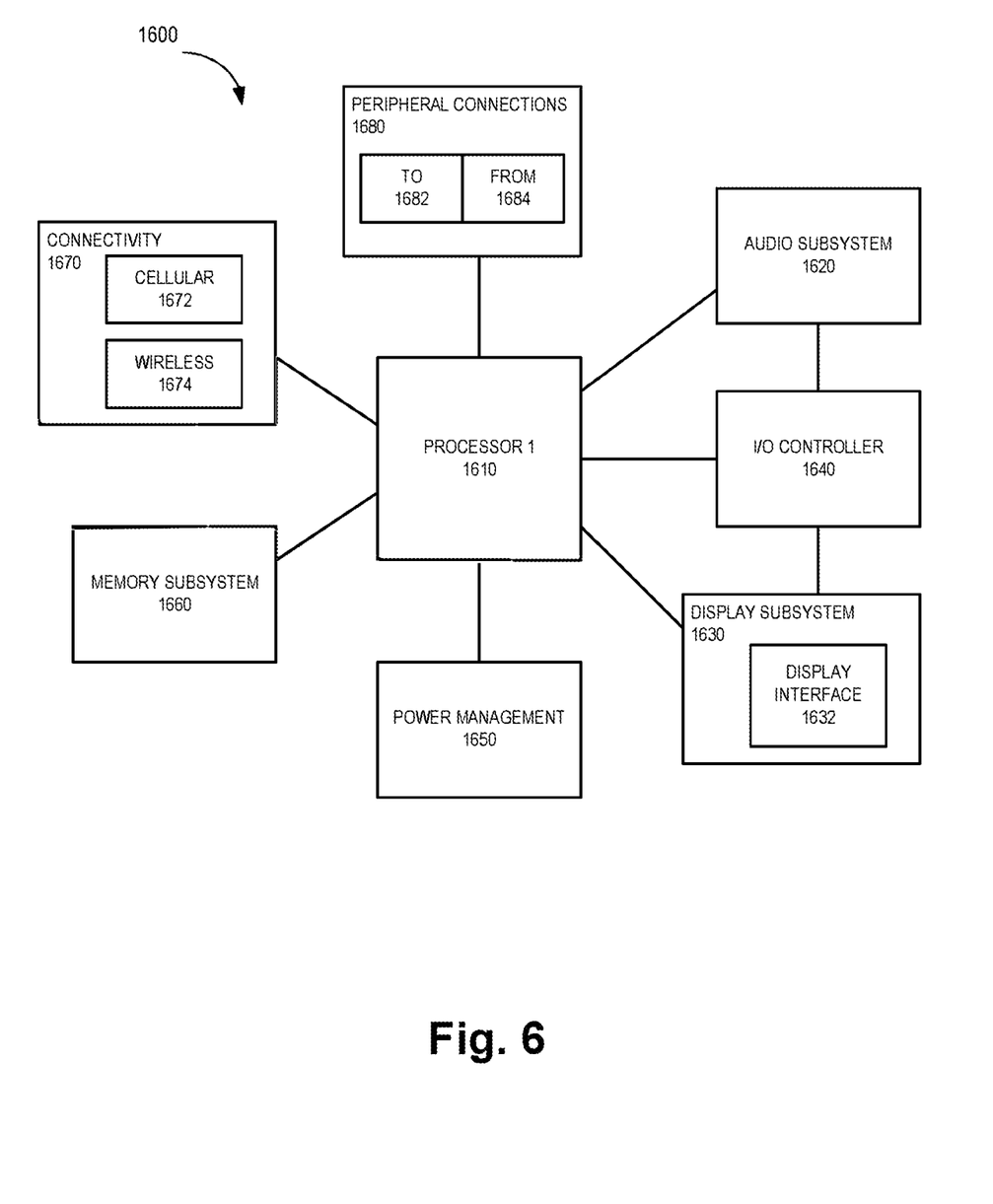
FIG. 6 illustrates a smart device or a computer system or a SoC (System-on-Chip) having back-gate multilayer crystalline TFTs, according to some embodiments.

FIG. 6 illustrates a smart device or a computer system or a SoC (System-on-Chip) 1600 including back-gate multilayer crystalline TFTs, according to some embodiments.

For purposes of the embodiments, the transistors for the FEOL in various circuits and logic blocks described here are metal oxide semiconductor (MOS) transistors or their derivatives, where the MOS transistors include drain, source gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example. Bipolar junction transistors (BJT PNP/NPN), BiCMOS. CMOS, etc., may be used without departing from the scope of the disclosure. In some embodiments, memory cells are formed using back-gate multilayer crystalline TFT. In some embodiments, the back-gate multilayer crystalline TFT can also be used for other circuits formed on BEOL of the SoC.

FIG. 6 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600. In some embodiments, one or more blocks (even all blocks) may be powered using the super-capacitor.

In some embodiments, computing device 1600 includes first processor 1610 and network interface within 1670 such as a wireless interface so that a system embodiment may be incorporated into a wireless device, for example, cell phone or personal digital assistant. Any of the various blocks of computing device 1600 can have or use the super capacitor of various embodiments.

In some embodiments, processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally. I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above. I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600. In some embodiments, Memory subsystem 1660 includes the scheme of analog in-memory pattern matching with the use of resistive memory elements. In some embodiments, memory subsystem includes the 1T-1C memory using TFTs, according to some embodiments.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs. RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives. CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces). Display Port including MiniDisplayPort (MDP), High Definition Multimedia Interface (HDMI), Firewire, or other types.

Reference in the specification to "an embodiment." "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1. An apparatus comprising: a gate comprising a metal; a first layer adjacent to the gate, the first layer comprising a dielectric material; a second layer adjacent to the first layer, the second layer comprising a second material; a third layer adjacent to the second layer, the third layer comprising a third material including an amorphous metal oxide; a fourth layer adjacent to the third layer, the fourth layer comprising a fourth material, wherein the second and fourth materials are different than the third material; a source partially adjacent to the fourth layer; and a drain partially adjacent to the fourth layer.

Example 2. The apparatus of example 1, wherein the dielectric material is a high-K dielectric material which includes one or more of: hafnium silicate, zirconium silicate, hafnium dioxide, zirconium dioxide, aluminum oxide, or nitride hafnium silicate.

Example 3. The apparatus of example 1, wherein the dielectric material is a high-K dielectric material which includes one or more of: Hf, Si, O, Zr, Al, or N.

Example 4. The apparatus according to any one of claims 1 to 3, wherein the second or fourth materials include one or more of: c axis aligned crystalline Indium gallium zinc oxide (IGZO), crystalline IGZO, Yttrium-doped zinc oxide (YZO), Zinc oxide (ZnO), Indium Zinc Oxide (IZO), Zinc tin oxide (ZTO), low temperature (LT) poly Si, LT poly Germanium (Ge), or transmission metal di-chalcogenides (TMDs).

Example 5. The apparatus of example 3, wherein the TMDs include one or more of: $MoS_2$, $WS_2$, $MoSe_2$, $WSe_2$, or $MoTe_2$.

Example 6. The apparatus according to any one of examples 1 to 5, wherein the second or fourth materials include one or more of: In, Ga, Zn, O, Y, Sn, Ge, Si, Mo, Se, W, S, or Te.

Example 7. The apparatus of according to any one of examples 1 to 6, wherein the second and fourth materials are different.

Example 8. The apparatus of according to any one of examples 1 to 6, wherein the second and fourth materials are same.

Example 9. The apparatus according to any one of examples 1 to 6, wherein the amorphous metal oxide of the third layer includes Indium gallium zinc oxide (IGZO).

Example 10. The apparatus according to any one of examples 1 to 6, wherein the third layer includes one or more of: In, Ga, Zn, or O.

Example 11. The apparatus according to any of the preceding examples, wherein the second, third, and fourth layers have a combined thickness less than 60 nm.

Example 12. The apparatus according to any of the preceding examples, wherein each of the second, third, and fourth layers have a thickness in a range of 2 nm to 20 nm.

Example 13. The apparatus according to any of the preceding examples, wherein each of the second, third, and fourth layers have a length in a range of 30 nm to 180 nm.

Example 14. The apparatus according to any of the preceding examples, wherein the first layer has a thickness in range of 2 nm to 10 nm.

Example 15. The apparatus according to any of the preceding examples, wherein the gate has a thickness in a range of 5 nm to 20 nm.

Example 16. The apparatus according to any of the preceding examples, wherein the metal of the gate includes one or more of: Ti, N, Ta, W, C, Pt, Cr, Hf, or Ta.

Example 17. The apparatus according to any of the preceding examples, wherein the source and drain comprise a material which includes one or more of: Ti, N, Ta, W, C, Pt, Cr, Hf, or Ta.

Example 18. The apparatus according to any of the preceding examples, wherein the source and drain are separated by an insulator comprising O.

Example 19. The apparatus according to any of the preceding examples, wherein the source and drain are separated by a distance in a range of 10 nm to 80 nm.

Example 20. The apparatus according to any of the preceding examples, wherein the gate is biased by a voltage in a range of −0.7 V to 3.3V.

Example 21. An apparatus comprising: a thin film transistor (TFT) according to any one of claims 1 to 20; and a capacitor coupled the TFT; a word-line coupled to a gate of the TFT; and a bit-line coupled to the source/drain of the TFT.

Example 22. The apparatus of example 21, wherein the TFT and the capacitor are positioned in back-end-on-line (BEOL) of a die.

Example 23. The apparatus of example 22 comprises one or more circuitries positioned in front-end-of-line (FEOL) of the die, wherein the one or more circuitries are coupled to the bit-line and/or word-line.

Example 24. A system comprising: a processor; a memory coupled to the processor, the memory including an apparatus according to any one of examples 1 to 20 or example 21 to 23; and a wireless interface to allow the processor to couple to another device.

Example 25. A method comprising: forming a gate comprising a metal; forming a first layer adjacent to the gate, the first layer comprising a dielectric material; forming a second layer adjacent to the first layer, the second layer comprising a second material; forming a third layer adjacent to the second layer, the third layer comprising a third material including an amorphous metal oxide; forming a fourth layer adjacent to the third layer, the fourth layer comprising a fourth material, wherein the second and fourth materials are different than the third material; forming a source partially adjacent to the fourth layer, and forming a drain partially adjacent to the fourth layer.

Example 26. The method of example 25, wherein the dielectric material is a high-K dielectric material which includes one or more of: hafnium silicate ($HfSiO_4$), zirconium silicate ($ZrSiO_4$), hafnium dioxide ($HfO_2$), zirconium dioxide ($ZrO_2$), aluminum oxide ($Al_2O_3$), or nitride hafnium silicate (HfSiON).

Example 27. The method of example 25, wherein the dielectric material is a high-K dielectric material which includes one or more of: Hf, Si, O, Zr, Al, or N.

Example 28. The method according to any one of examples 25 to 26, wherein the second or fourth materials include one or more of: c axis aligned crystalline Indium gallium zinc oxide (IGZO), crystalline IGZO, Yttrium-doped zinc oxide (YZO), Zinc oxide (ZnO), Indium Zinc Oxide (IZO). Zinc tin oxide (ZTO), low temperature (LT) poly Si, LT poly Germanium (Ge), or transmission metal di-chalcogenides (TMDs).

Example 29. The method of example 28, wherein the TMDs include one or more of: $MoS_2$, $WS_2$, $MoSe_2$, $WSe_2$, or $MoTe_2$.

Example 30. The method according to any one of examples 25 to 29, wherein the second or fourth materials include one or more of: In, Ga, Zn, O, Y, Sn, Ge, Si, Mo, Se, W, S, or Te.

Example 31. The method of according to any one of examples 25 to 29, wherein the second and fourth materials are different.

Example 32. The method of according to any one of examples 25 to 29, wherein the second and fourth materials are same.

Example 33. The method according to any one of examples 25 to 29, wherein the amorphous metal oxide of the third layer includes Indium gallium zinc oxide (IGZO).

Example 34. The method according to any one of claims 25 to 29, wherein the third layer includes one or more of: In, Ga, Zn, or O.

Example 35. The method according to any of the preceding method examples, wherein the second, third, and fourth layers have a combined thickness which is less than 60 nm.

Example 36. The method according to any of the preceding method examples, wherein each of the second, third, and fourth layers have a thickness in a range of 2 nm to 20 nm.

Example 37. The method according to any of the preceding method examples, wherein each of the second, third, and fourth layers have a length in a range of 30 nm to 180 nm.

Example 38. The method according to any of the preceding method examples, w % herein the first layer has a thickness in range of 2 nm to 10 nm.

Example 39. The method according to any of the preceding method examples, wherein the gate has a thickness in a range of 5 nm to 20 nm.

Example 40. The method according to any of the preceding method examples, wherein the metal of the gate includes one or more of: Ti, N, Ta, W, C, Pt, Cr, Hf, or Ta.

Example 41. The method according to any of the preceding method examples, wherein the source and drain comprise a material which includes one or more of: Ti, N, Ta, W, C, Pt, Cr, Hf, or Ta.

Example 42. The method according to any of the preceding method examples, wherein the source and drain are separated by an insulator comprising O.

Example 43. The method according to any of the preceding method examples, wherein the source and drain are separated by a distance in a range of 10 nm to 80 nm.

Example 44. The method according to any of the preceding method examples, wherein the gate is biased by a voltage in a range of −0.7 V to 3.3V.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An integrated circuit comprising:
 a gate comprising a metal;
 a first layer adjacent to the gate, the first layer comprising a dielectric material;
 a second layer adjacent to the first layer, the second layer comprising a second material;
 a third layer adjacent to the second layer, the third layer comprising a third material including an amorphous metal oxide;
 a fourth layer adjacent to the third layer, the fourth layer comprising a fourth material that is crystalline, wherein the second and fourth materials are different than the third material;
 a source at least partially adjacent to the fourth layer; and
 a drain at least partially adjacent to the fourth layer;
 wherein the gate, the first layer, the second layer, the third layer, the fourth layer, the source, and the drain are positioned in one or more interconnect layers.

2. The integrated circuit of claim 1, wherein the second material is crystalline.

3. The integrated circuit of claim 1, comprising a capacitor, coupled to one of the source or the drain.

4. The integrated circuit of claim 1, wherein the one or more interconnect layers are above a device layer.

5. The integrated circuit of claim 1, wherein the dielectric material is a first dielectric material and includes a high-K dielectric material, and wherein the one or more interconnect layers comprise conductive interconnects embedded in a second dielectric material.

6. The integrated circuit of claim 1, wherein the source and the drain comprise a material which includes one or more of: titanium, nitrogen, tungsten, carbon, platinum, chromium, hafnium, or tantalum.

7. The integrated circuit of claim 1, wherein the dielectric material is a high-K dielectric material, which includes one or more of: hafnium silicate, zirconium silicate, hafnium dioxide, zirconium dioxide, aluminum oxide, or nitride hafnium silicate.

8. The integrated circuit of claim 1, wherein the dielectric material is a high-K dielectric material which includes one or more of hafnium, silicon, oxygen, zirconium, aluminum, and nitrogen.

9. The integrated circuit of claim 1, wherein the second or fourth materials include one or more of: c axis aligned crystalline indium gallium zinc oxide (IGZO), crystalline IGZO, yttrium-doped zinc oxide (YZO), zinc oxide (ZnO), indium zinc oxide (IZO), zinc tin oxide (ZTO), low temperature poly silicon (Si), low temperature poly germanium (Ge), or one or more transmission metal di-chalcogenides (TMDs).

10. The apparatus of claim 9, wherein the one or more TMDs include one or more of: molybdenum disulfide, tungsten disulfide, molybdenum diselenide, tungsten diselenide, or molybdenum ditelluride.

11. The apparatus of claim 1, wherein the second or fourth materials include one or more of: indium, gallium, zinc, oxygen, yttrium, tin, germanium, silicon, molybdenum, selenium, tungsten, sulfur, or tellurium.

12. The apparatus of claim 1, wherein the amorphous metal oxide of the third layer includes indium gallium zinc oxide (IGZO).

13. The apparatus of claim 1, wherein the second, third, and fourth layers have a combined thickness of less than 60 nm.

14. The apparatus of claim 1, wherein each of the source, the drain, and the metal of the gate comprise a material which includes one or more of: titanium, nitrogen, tungsten, carbon, platinum, chromium, hafnium, or tantalum.

15. An apparatus comprising:
a thin film transistor (TFT) including:
- a gate comprising a metal;
- a first layer adjacent to the gate, the first layer comprising a dielectric material;
- a second layer adjacent to the first layer, the second layer comprising a second material;
- a third layer adjacent to the second layer, the third layer comprising a third material including an amorphous metal oxide;
- a fourth layer adjacent to the third layer, the fourth layer comprising a fourth material, wherein the second and fourth materials are different than the third material;
- a source partially adjacent to the fourth layer; and
- a drain partially adjacent to the fourth layer;

a capacitor coupled the TFT;
a word-line coupled to the gate of the TFT; and
a bit-line coupled to one or more of the source and the drain of the TFT, wherein the TFT and the capacitor are positioned in one or more interconnect layers.

16. The apparatus of claim 15, comprising one or more circuitries positioned in a front-end-of-line (FEOL) of the die, wherein the one or more circuitries are coupled to at least one of the bit-line and word-line.

17. The apparatus of claim 15, wherein the second and fourth materials are crystalline.

18. A system comprising:
a processor circuitry to execute one or more instructions;
a memory coupled to the processor circuitry, the memory including:
- a gate comprising a metal;
- a first layer adjacent to the gate, the first layer comprising a dielectric material;
- a second layer adjacent to the first layer, the second layer comprising a second material;
- a third layer adjacent to the second layer, the third layer comprising a third material including an amorphous metal oxide;
- a fourth layer adjacent to the third layer, the fourth layer comprising a fourth material, wherein the second and fourth materials are different than the third material;
- a source partially adjacent to the fourth layer; and
- a drain partially adjacent to the fourth layer;
- wherein the gate, the first layer, the second layer, the third layer, the fourth layer, the source, and the drain are positioned in one or more interconnect layers.

19. The system of claim 18, wherein the second and fourth materials are crystalline.

20. The system of claim 18, wherein the source and the drain are coplanar, and the gate, the first layer, the second layer, the third layer, and the fourth layer are not coplanar.

* * * * *